(12) United States Patent
Hassler et al.

(10) Patent No.: US 9,766,102 B2
(45) Date of Patent: Sep. 19, 2017

(54) CALIBRATION DEVICE FOR A NETWORK ANALYZER

(75) Inventors: Martin Hassler, Munich (DE); Wolfgang Richter, Haar (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 605 days.

(21) Appl. No.: 13/818,452

(22) PCT Filed: Jul. 26, 2011

(86) PCT No.: PCT/EP2011/062776
§ 371 (c)(1),
(2), (4) Date: Feb. 22, 2013

(87) PCT Pub. No.: WO2012/025320
PCT Pub. Date: Mar. 1, 2012

(65) Prior Publication Data
US 2013/0158927 A1    Jun. 20, 2013

(30) Foreign Application Priority Data
Aug. 24, 2010  (DE) .................. 10 2010 035 191

(51) Int. Cl.
*G01D 18/00* (2006.01)
*G01R 27/28* (2006.01)
*G01R 35/00* (2006.01)
*G06F 17/00* (2006.01)

(52) U.S. Cl.
CPC ........... *G01D 18/006* (2013.01); *G01R 27/28* (2013.01); *G01R 35/007* (2013.01); *G06F 17/00* (2013.01)

(58) Field of Classification Search
CPC .... G01D 18/006; G01R 27/28; G01R 35/007; G06F 17/00
USPC .......................................................... 702/85
See application file for complete search history.

(56) References Cited

U.S. PATENT DOCUMENTS

| 6,841,401 B1 * | 1/2005 | Nishimoto ........... G01D 18/008 438/10 |
| 6,965,241 B1 | 11/2005 | Liu |
| 2001/0021092 A1 * | 9/2001 | Astala ................... H02J 7/0029 361/90 |

(Continued)

FOREIGN PATENT DOCUMENTS

| DE | 102005018073 A1 | 9/2006 |
| WO | 2004113936 A1 | 12/2004 |

OTHER PUBLICATIONS

International Search Report mailed Dec. 6, 2011, issued in the corresponding International Application No. PCT/EP2011/062776, filed Jul. 26, 2011, 3 pages.

*Primary Examiner* — Toan Le
*Assistant Examiner* — Xiuquin Sun
(74) *Attorney, Agent, or Firm* — Chirstensen O'Connor Johnson Kindness PLLC (57) ABSTRACT

A calibration device for a network analyzer with several ports provides a calibration circuit, which is connected in each case via a terminal port respectively to one of the several ports of the network analyzer. A first transistor and a second transistor are connected in series to each terminal port. In this context, both transistors are connected by their common connection to the terminal port. The first transistor and/or the second transistor is operated as an adjustable load.

17 Claims, 8 Drawing Sheets

(56) References Cited

U.S. PATENT DOCUMENTS

| | | | |
|---|---|---|---|
| 2004/0150411 A1* | 8/2004 | Liu | G01R 35/005 324/601 |
| 2005/0200365 A1 | 9/2005 | Bradley | |
| 2006/0055394 A1* | 3/2006 | Dunsmore | G01R 35/005 324/76.19 |
| 2008/0197858 A1 | 8/2008 | Martens | |
| 2010/0201397 A1* | 8/2010 | Gillingham | H03K 19/0005 326/30 |

* cited by examiner

CALIBRATION DEVICE FOR A NETWORK ANALYZER

FIELD OF THE DISCLOSURE

The present disclosure relates to an electronic calibration device for a network analyzer with several ports.

High-precision measuring devices such as network analyzers must be calibrated at regular intervals to ensure that the required accuracy of measurement is still achieved. In some cases, with network analyzers with a very broad bandwidth, covering, for example, a frequency range from a few kHz up to approximately 70 GHz, such a calibration may be required several times per day.

However, electronic calibration devices are currently structured in such a manner that, for the above-named frequency range, they cover a maximum of two ports of the network analyzer. For a complete calibration, for example, with a 4-port network analyzer, the calibration device must be connected successively to different ports. This connection is time-consuming, and errors, resulting, for example, from a screw connection which has not been tightened firmly enough, and from associated, undesirable reflection sites, necessitate a repetition of the entire calibration procedure.

An electronic calibration device for a network analyzer with two ports is disclosed in U.S. Pat. No. 6,914,436 B2. The calibration device supports the known calibration standards "open" (English: open), "short" (English: short), "match" (English: match) and "through" (English: through). In this context, the calibration device comprises individual SPDTs (English: Single Pole Double Throw; German: Einzel-Pol doppelt umlegend), which are connected to one another and integrated together on a chip.

The disadvantage with U.S. Pat. No. 6,914,436 B2 is that a calibration device for a 2-port network analyzer requires four SPDTs, wherein each SPDT comprises six transistors, and accordingly, a total of 24 transistors are required. Moreover, separate terminations are provided, so that the structure of the calibration device is complex even for two ports and increases in complexity with further test ports. The attainable upper-threshold frequency is thus severely reduced.

SUMMARY OF THE DISCLOSURE

Accordingly, the object of the present disclosure is to provide a calibration device of which the structure includes a minimal number of components in order to minimize the required chip area and to increase the upper-threshold frequency.

The object is achieved with regard to the calibration device by the features of claim 1. Advantageous further developments of the calibration device according to the present disclosure are specified in the dependent claims.

The calibration device according to the present disclosure for a network analyzer with several ports provides a calibration circuit, which is connected, in each case via one terminal port, respectively to one of several ports of the network analyzer, wherein a first transistor and a second transistor are connected in series to each terminal port, and wherein both transistors are connected to the terminal port by their common connection. In this context, the first and/or the second transistor is operated as an adjustable load.

It is particularly advantageous that the first and/or second transistor can be operated as an adjustable load. Accordingly, a separate termination and further transistors can be dispensed with, thereby further reducing the size of the calibration circuit. Only in this manner is it possible for the calibration device to become suitable for a network analyzer with several ports and a high upper-threshold frequency.

A further advantage is achieved if the adjustable load of the first transistor can be set by applying a gate voltage or a base current. In this manner, the operating point of the transistor can be matched in a very simple manner. This occurs very rapidly, so that the calibration procedure can be concluded very quickly.

An additional advantage is achieved if temperature-dependent properties of the first transistor are compensated during the adjustment of the gate voltage or the base current. As a result, the load to be adjusted can also be set very accurately in the case of different ambient temperatures, thereby further increasing the accuracy of the calibration procedure.

Moreover, an advantage is achieved if the calibration device provides a thermostatic control, so that the calibration device can be heated to a constant temperature. As a result, the temperature-dependent properties of the transistors are taken into consideration and compensated in an improved manner, because the calibration circuit always provides the same temperature.

A further advantage is achieved if precisely one first and precisely one second transistor are present in the calibration circuit for each of the several ports of the network analyzer. Accordingly, the overall number of components required can be further minimized, so that, for example, an 8-port network analyzer requires a calibration device of which the calibration circuit must provide just 16 transistors, wherein the chip size of the calibration circuit can be further reduced, and the upper-threshold frequency can be increased.

Finally, an advantage is achieved if the first and the second transistor form a transistor pair, and accordingly, several such transistor pairs can be connected to one another via a terminal of the second transistor not connected to the common connection. This therefore allows the cyclical expansion of the calibration circuit, in order to calibrate network analyzers with an arbitrary number of test ports, without the need to connect the calibration device successively to different test ports of the network analyzer. Accordingly, on the one hand, the calibration procedure can be accelerated and, on the other hand, the probability for the occurrence of errors can be reduced.

BRIEF DESCRIPTION OF THE DRAWINGS

Various exemplary embodiments of the present disclosure are described by way of example below with reference to the drawings. Identical subject matters provide the same reference numbers. In detail, the corresponding figures in the drawings are as follows.

DETAILED DESCRIPTION OF THE DISCLOSURE

Figure 1:
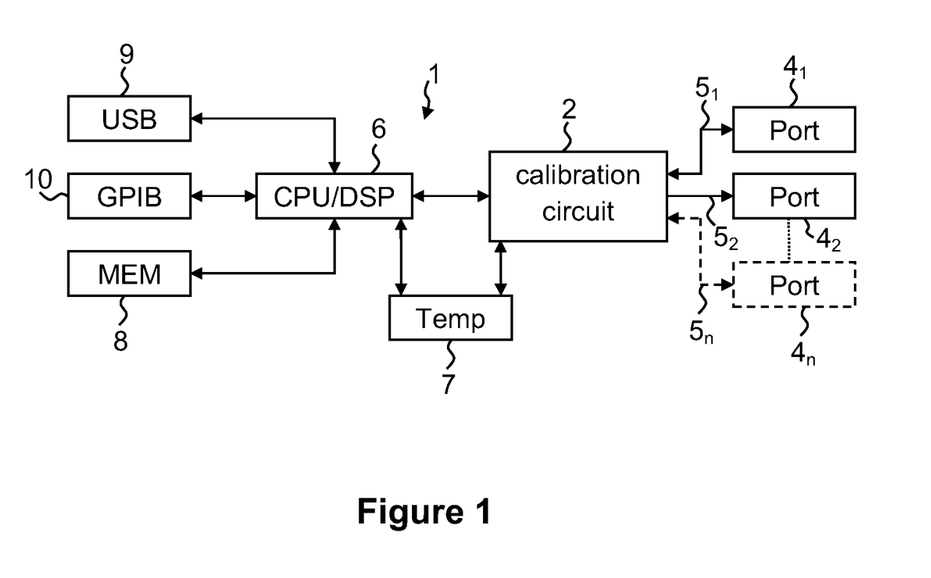
FIG. 1 shows a block-circuit diagram of an exemplary embodiment of a calibration device according to the present disclosure with a calibration circuit.

FIG. 1 shows a block-circuit diagram of an exemplary embodiment of a calibration unit 1 with the calibration circuit 2 according to the present disclosure. The calibration circuit 2 is connected via several terminal ports $3_1$, $3_2$ to $3_n$, which are not illustrated in FIG. 1, to several external ports $4_1$, $4_2$ to $4_n$ of the calibration device 1. This connection $5_1$, $5_2$ to $5_n$ is preferably embodied via a coaxial-coplanar microwave junction, as described in the patent application DE 10 2007 013 968 A1, the content of which is adopted in full into the present description by way of reference. Such a coaxial-coplanar microwave junction provides a very broad bandwidth and is optimal both in terms of reflection and also attenuation, while at the same time allowing a good mechanical and thermal de-coupling between the coplanar conductor system and the coaxial line. In this context, the external ports $4_1$, $4_2$ to $4_n$ of the calibration device 1 are preferably connected to the several ports of the network analyzer via a coaxial line.

The calibration device 1 according to the present disclosure further provides a central-processing unit 6 (English: central-processing unit) and/or a digital signal processor 6. This central-processing unit 6 is connected via a data connection to the calibration circuit 2. The central-processing unit 6 controls the calibration circuit 2 via this data connection in such a manner that the calibration circuit connects the terminal ports $3_1$, $3_2$ to $3_n$ to one another or to different loads. A precise explanation of this will be given later in the description.

Moreover, the calibration device 1 preferably provides a thermostatic control 7, by means of which the calibration circuit 2 can be heated to a constant temperature. The thermostatic control 7 is connected at one end via a first data connection to the central-processing unit 6 and at the other end via a second data connection to the calibration circuit 2. In this context, temperature values of the calibration circuit 2 are preferably registered via the second data connection. These are transmitted via the first data connection to the central-processing unit 6. The central-processing unit 6 specifies the target value for a temperature, to which the thermostatic control 7 should heat the calibration circuit 2 with the heating elements, which are not illustrated. This target value is preferably selected in such a manner that it is not reached by the normal ambient temperature. A target value from 30 to 50° C., preferably approximately 40° C., has proved advantageous, because the ageing process of the calibration circuit 2, especially of the transistors within the calibration circuit 2, is negligible at 40° C., and this value is disposed above the expected ambient temperature. The thermostatic control 7 controls the heating elements, which are not illustrated, in such a manner that the specified target value is reached as accurately as possible.

Furthermore, the calibration device 1 provides a memory unit 8 (English: memory unit). The memory unit 8 is connected via a data connection to the central-processing unit 6. The memory unit 8 contains correction data, which accurately describe the frequency-dependent behaviour of the calibration circuit 2 and of all terminal connections between the calibration circuit 2 and the external ports $4_1$, $4_2$ to $4_n$. Furthermore, the temperature-dependent behaviour of the calibration circuit 2 is stored in the memory unit 8.

Moreover, the calibration device 1 provides an interface, preferably a USB connection 9 (English: universal serial bus; German: universeller serieller Bus) and/or a GPIB connection 10 (English: general-purpose interface bus; German: Schnittstellen Bus für allgemeine Verwendung). Via these connections 9, 10, the calibration device 1 is connected to the network analyzer to be calibrated. By means of this data connection, the network analyzer communicates to the calibration device 1 which calibration standard (for example, "open", "short", "match", "through") is to be measured at which frequency, and optionally at which amplitude. The calibration device 1 sets the required calibration standard and communicates the corresponding correction data to the network analyzer. The communication of the correction data between the calibration device 1 and the network analyzer can also be implemented as a whole at the beginning of the calibration.

Figure 2:
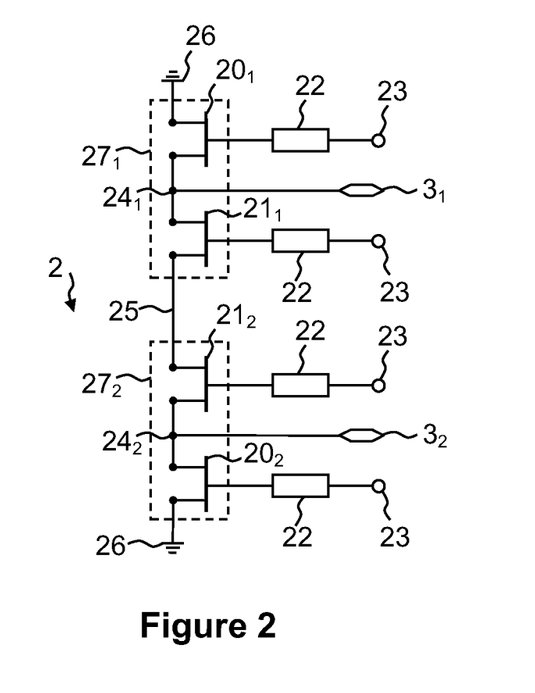
FIG. 2 shows a block-circuit diagram of an exemplary embodiment of the calibration circuit according to the present disclosure for two ports of the network analyzer to be calibrated.

FIG. 2 shows a block-circuit diagram of an exemplary embodiment of the calibration circuit 2 according to the present disclosure for a network analyzer with two ports to be calibrated. However, as will be explained further below, the calibration circuit 2 according to the present disclosure can also be used for n-ports where n>2. The structure of the calibration device 1 with the calibration circuit 2 according to the present disclosure is such that for each of the several ports of the network analyzer to be calibrated, an external port $4_1$, $4_2$ to $4_n$ is provided on the housing of the calibration device 1, which is preferably connected via a coaxial-coplanar microwave junction, in each case to one terminal port $3_1$, $3_2$ to $3_n$ of the calibration circuit 2. The phrase "several ports of the network analyzer to be calibrated" should be understood to designate at least two ports up to infinitely many ports, wherein two or four or eight ports are preferably involved. At each terminal port $3_1$, $3_2$ to $3_n$ of the calibration circuit 2, a first transistor $20_1$, $20_2$ to $20_n$ and a second transistor $21_1$, $21_2$ to $21_n$ is connected in series, wherein both transistors $20_1$, $20_2$ to $20_n$ and $21_1$, $21_2$ to $21_n$ are connected at their common connection $24_1$, $24_2$ to $24_n$ to the terminal port $3_1$, $3_2$ to $3_n$.

In this context, a first terminal of the first transistor $20_1$, $20_2$ to $20_n$ is connected to a reference ground 26. A second terminal of the first transistor $20_1$, $20_2$ to $20_n$ is connected via the common connection $24_1$, $24_2$ to $24_n$ to a first terminal of the second transistor $21_1$, $21_2$ to $21_n$, so that it is possible to speak of a series circuit between the first transistor $20_1$, $20_2$ to $20_n$ and the second transistor $21_1$, $21_2$ to $21_n$. A third terminal of the first transistor $20_1$, $20_2$ to $20_n$ and of the second transistor $21_1$, $21_2$ to $21_n$ is preferably connected via a protective resistor 22 at the terminal 23 to a voltage source or current source, which is not illustrated. The transistors $20_1$, $20_2$ to $20_n$ and $21_1$, $21_2$ to $21_n$ are preferably field-effect transistors and, within this group, especially pHEMT transistors (English: pseudomorphic high electron mobility transistor; German: pseudomorphischer Transistor mit hoher Elektronenbeweglichkeit). In this case, the third terminal of the first transistor $20_1$, $20_2$ to $20_n$ and of the second transistor $21_1$, $21_2$ to 21 is the gate (German: Tor), and the voltage supplied to the terminal 23 is also referred to as the control voltage or gate voltage. Furthermore, the first terminal of the first transistor $20_1$, $20_2$ to $20_n$ and of the second transistor $21_1$, $21_2$ to $21_n$ is a source terminal (German: Quelle), and the second terminal of the first transistor $20_1$, $20_2$ to $20_n$ and the second transistor $21_1$, $21_2$ to $21_n$ is a drain terminal (German: Senke).

In each case, the first transistor $20_1$, $20_2$ to $20_n$ and the corresponding second transistor $21_1$, $21_2$ to $21_n$ form a transistor pair $27_1$, $27_2$ to $27_n$, wherein several such transistor pairs $27_1$, $27_2$ to $27_n$ can be connected to one another via a terminal of the second transistor $21_1$, $21_2$ to $21_n$ not connected to the common connection $24_1$, $24_2$ to $24_n$. This connection of the transistor pairs $27_1$, $27_2$ to $27_n$ to one another is embodied here via the connecting line 25, to which all transistor pairs $27_1$, $27_2$ to $27_n$ are connected in parallel. The terminal of the second transistor $21_1$, $21_2$ to $21_n$ not connected to the common connection $24_1$, $24_2$ to $24_n$ is the second terminal of the second transistor $21_1$, $21_2$ to $21_n$ or respectively, for example, the drain terminal of the second transistor $21_1$, $21_2$ to $21_n$ with the use of field-effect transistors.

Since precisely one first transistor $20_1$, $20_2$ to $20_n$ and one second transistor $21_1$, $21_2$ to $21_n$ is provided for each of the several ports of the network analyzer in the calibration circuit 2, very many transistor pairs $27_1$, $27_2$ to $27_n$ can be connected to one another in parallel until the parasitic capacitance finally increases to such an extent that the upper-threshold frequency of the calibration device 1 is no longer adequate for the network analyzer to be calibrated.

It is particularly advantageous to operate the first transistor $20_1$, $20_2$ to $20_n$ and/or the second transistor $21_1$, $21_2$ to $21_n$ as an adjustable load. However, in the illustrated exemplary embodiments according to the present disclosure, only the first transistor $20_1$, $20_2$ to $20_n$ can be operated as an adjustable load. The adjustable load of the preferably first transistor $20_1$, $20_2$ to $20_n$ in this context can be adjusted by applying a control voltage or respectively a gate voltage, or a control current or respectively a base current to the latter with the use of bipolar transistors. Accordingly, the operating point of the transistor is adjusted dependent upon the set control voltage or respectively gate voltage. Dependent upon the set gate voltage, the ohmic resistance of the first transistor $20_1$, $20_2$ to $20_n$ varies in such a manner that the conducting state and the off-state of the first transistor $20_1$, $20_2$ to $20_n$ and also all intermediate resistive states can be adjusted. In this context, the intermediate resistive states are disposed between the low-ohmic conductive state and the high-ohmic off-state. With a typically selected intermediate resistive state, the resistance value of the first transistor $20_1$, $20_2$ to $20_n$ is, for example, 50 ohms.

Accordingly, the first transistor $20_1$, $20_2$ to $20_n$ is preferably not operated in saturation, but, with the use of field-effect transistors, within the triode range.

However, the first transistor $20_1$, $20_2$ to $20_n$ should not be operated in saturation. Alongside the control voltage or respectively gate voltage, the adjusted load or respectively the intermediate resistive states are primarily still dependent, for example, on the drain-source voltage, the temperature of the transistor and the frequency of the signal applied. This behaviour of the first transistor $20_1$, $20_2$ to $20_n$, which is heavily dependent upon external factors, is stored in the memory unit 8 in the form of calibration data. In order to minimize the influence of temperature, the calibration circuit 2 is heated to a constant temperature via heating elements connected to the thermostatic control 7. Accordingly, the number of calibration data required can be reduced.

The first transistor $20_1$, $20_2$ to $20_n$, which is connected by its first terminal to the reference ground 26, is preferably used in order to connect the calibration standards "open", "short" and "match" via the common connection $24_1$, $24_2$ to $24_n$ to the terminal ports $3_1$, $3_2$ to $3_n$ and accordingly to the several ports of the network analyzer. In the case of the calibration standard "match", the control voltage or gate voltage or the control current or base current of the first transistor $20_1$, $20_2$ to $20_n$ is adjusted in such a manner that the intermediate resistive state or the adjusted load corresponds as far as possible to a system impedance of the network analyzer to be calibrated. The system impedance is usually 50 ohms, wherein other values can also be adjusted by varying the control voltage or gate voltage or the control current or base current. The calibration standards "open" and "short" can be realised by placing the first transistor $20_1$, $20_2$ to $20_n$ in the off-state or the fully conductive state.

The state table (1) contains all of the required states of the transistors $20_1$, $20_2$ and $21_1$, $21_2$ from FIG. 2.

TABLE 1

| State | $T20_1$ | $T21_1$ | $T20_2$ | $T21_2$ |
|---|---|---|---|---|
| Open $3_1$ | $V_{off}$ | $V_{off}$ | $V_{on}$ | $V_{on}$ |
| Short $3_1$ | $V_{on}$ | $V_{off}$ | $V_{on}$ | $V_{on}$ |
| Match $3_1$ | $V_{50}$ | $V_{off}$ | $V_{on}$ | $V_{on}$ |
| Open $3_2$ | $V_{on}$ | $V_{on}$ | $V_{off}$ | $V_{off}$ |
| Short $3_2$ | $V_{on}$ | $V_{on}$ | $V_{on}$ | $V_{off}$ |
| Match $3_2$ | $V_{on}$ | $V_{on}$ | $V_{50}$ | $V_{off}$ |
| Through $3_1 \leftrightarrow 3_2$ | $V_{off}$ | $V_{on}$ | $V_{off}$ | $V_{on}$ |

For example, as soon as the calibration standard "open" is to be connected for the terminal port $3_1$, the transistors $20_1$, $21_1$ connected to the terminal port $3_1$ are switched into the off-state. In order to increase the isolation, the other transistors $20_2$, $21_2$ are switched into the conducting state. The same applies for the calibration standards "short" and "match", both for the terminal port $3_1$ and also for the terminal port $3_2$. As soon as the calibration standard "through" is to be connected, the two first transistors $20_1$, $20_2$ are switched into the off-state and the two second transistors $20_1$, $20_2$ are switched into the conducting state.

It is also possible for the calibration standards "open", "short" and "match" to be adjusted and measured in parallel with one another for all of the several ports of the network analyzer. The state table (2) required for this shows the states to be adjusted for the transistors $20_1$, $20_2$ and $21_1$, $21_2$ from FIG. 2:

TABLE 2

| State | $T20_1$ | $T21_1$ | $T20_2$ | $T21_2$ |
|---|---|---|---|---|
| Open $3_1$ and $3_2$ | $V_{off}$ | $V_{off}$ | $V_{off}$ | $V_{off}$ |
| Short $3_1$ and $3_2$ | $V_{an}$ | $V_{off}$ | $V_{an}$ | $V_{off}$ |
| Match $3_1$ and $3_2$ | $V_{50}$ | $V_{off}$ | $V_{50}$ | $V_{off}$ |
| Through $3_1 \leftrightarrow 3_2$ | $V_{off}$ | $V_{an}$ | $V_{off}$ | $V_{an}$ |

As a result, it is possible to achieve a further reduction in the duration of the calibration procedure. Whether this is possible over the entire frequency range, for example, up to 70 GHz, depends upon the parasitic capacitances to be formed and the isolation capability of the transistors in the off-state. However, if required, this parallel adjustment of the three calibration standards "open", "short" and "match" can also be implemented only for one given frequency range, for example, up to 30 GHz, so that all calibration standards are adjusted and measured sequentially, for example, for frequencies above 30 GHz.

Figure 3:
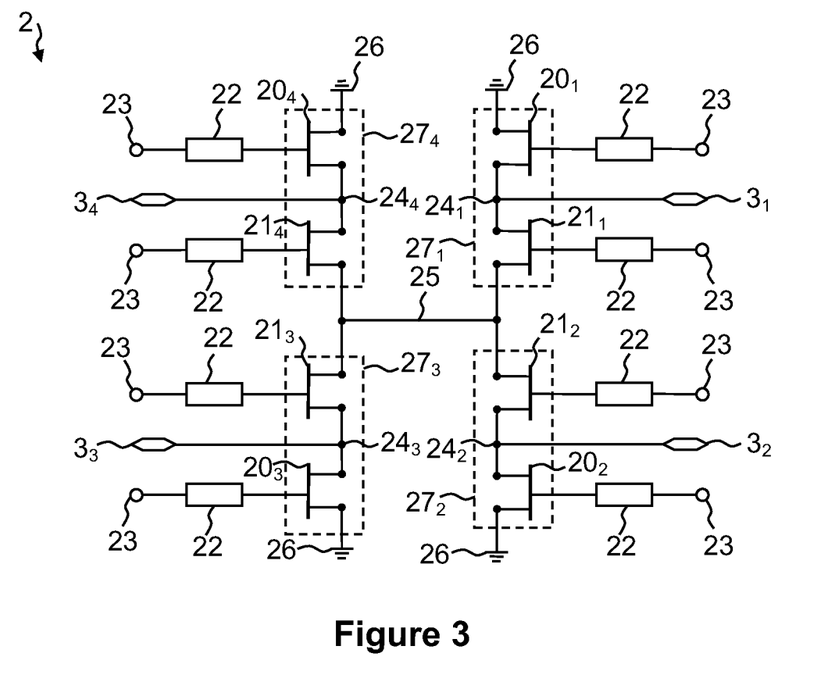
FIG. 3 shows a further block-circuit diagram of an exemplary embodiment of the calibration circuit according to the present disclosure for four ports of the network analyzer to be calibrated.

FIG. 3 shows a further block-circuit diagram of an exemplary embodiment of the calibration circuit 2 according to the present disclosure for up to four ports of the network analyzer to be calibrated. In each case, four transistor pairs $27_1$, $27_2$, $27_3$ and $27_4$, which are connected to one another via the connecting line 25, are illustrated. As in the case of the circuit arrangement from FIG. 2, it is also the second terminals of the second transistors $21_1$, $21_2$, $21_3$ and $21_4$, which are preferably connected to one another via the connecting line 25 in FIG. 3. The method of functioning of the individual transistor pairs $27_1$, $27_2$, $27_3$ and $27_4$ from FIG. 3 corresponds to the method of functioning of the transistor pairs $27_1$ and $27_2$ from FIG. 2, so that reference is made here to the corresponding part of the description for FIG. 2. In FIG. 3, those transistors $20_1$, $20_2$, $20_3$ and $20_4$, of which the first terminal is connected directly to the reference ground 26, can also preferably be operated as a variable load. The gate voltage required for this must be capable of being adjusted very accurately, for example, with 100-μV accuracy.

The state table (3) contains all of the required states of the transistors $20_1$, $20_2$ and $21_1$, $21_2$ from FIG. 3.

TABLE 3

| State | $T20_1$ | $T21_1$ | $T20_2$ | $T21_2$ | $T20_3$ | $T21_3$ | $T20_4$ | $T21_4$ |
|---|---|---|---|---|---|---|---|---|
| Open $3_1$ | $V_{off}$ | $V_{off}$ | $V_{on}$ | $V_{on}$ | $V_{on}$ | $V_{on}$ | $V_{on}$ | $V_{on}$ |
| Short $3_1$ | $V_{on}$ | $V_{off}$ | $V_{on}$ | $V_{on}$ | $V_{on}$ | $V_{on}$ | $V_{on}$ | $V_{on}$ |
| Match $3_1$ | $V_{50}$ | $V_{off}$ | $V_{on}$ | $V_{on}$ | $V_{on}$ | $V_{on}$ | $V_{on}$ | $V_{on}$ |
| Open $3_2$ | $V_{on}$ | $V_{on}$ | $V_{off}$ | $V_{off}$ | $V_{on}$ | $V_{on}$ | $V_{on}$ | $V_{on}$ |
| Short $3_2$ | $V_{on}$ | $V_{on}$ | $V_{on}$ | $V_{off}$ | $V_{on}$ | $V_{on}$ | $V_{on}$ | $V_{on}$ |
| Match $3_2$ | $V_{on}$ | $V_{on}$ | $V_{50}$ | $V_{off}$ | $V_{on}$ | $V_{on}$ | $V_{on}$ | $V_{on}$ |
| Open $3_3$ | $V_{on}$ | $V_{on}$ | $V_{on}$ | $V_{on}$ | $V_{off}$ | $V_{off}$ | $V_{on}$ | $V_{on}$ |
| Short $3_3$ | $V_{on}$ | $V_{on}$ | $V_{on}$ | $V_{on}$ | $V_{on}$ | $V_{off}$ | $V_{on}$ | $V_{on}$ |
| Match $3_3$ | $V_{on}$ | $V_{on}$ | $V_{on}$ | $V_{on}$ | $V_{50}$ | $V_{off}$ | $V_{on}$ | $V_{on}$ |
| Open $3_4$ | $V_{on}$ | $V_{on}$ | $V_{on}$ | $V_{on}$ | $V_{on}$ | $V_{on}$ | $V_{off}$ | $V_{off}$ |
| Short $3_4$ | $V_{on}$ | $V_{on}$ | $V_{on}$ | $V_{on}$ | $V_{on}$ | $V_{on}$ | $V_{on}$ | $V_{off}$ |
| Match $3_4$ | $V_{on}$ | $V_{on}$ | $V_{on}$ | $V_{on}$ | $V_{on}$ | $V_{on}$ | $V_{50}$ | $V_{off}$ |
| Through $3_1 \leftrightarrow 3_2$ | $V_{off}$ | $V_{on}$ | $V_{off}$ | $V_{on}$ | $V_{on}$ | $V_{off}$ | $V_{on}$ | $V_{off}$ |
| Through $3_1 \leftrightarrow 3_3$ | $V_{off}$ | $V_{on}$ | $V_{on}$ | $V_{off}$ | $V_{off}$ | $V_{on}$ | $V_{on}$ | $V_{off}$ |
| Through $3_1 \leftrightarrow 3_4$ | $V_{off}$ | $V_{on}$ | $V_{on}$ | $V_{off}$ | $V_{on}$ | $V_{off}$ | $V_{off}$ | $V_{on}$ |
| Through $3_2 \leftrightarrow 3_3$ | $V_{on}$ | $V_{off}$ | $V_{off}$ | $V_{on}$ | $V_{off}$ | $V_{on}$ | $V_{on}$ | $V_{off}$ |
| Through $3_2 \leftrightarrow 3_4$ | $V_{on}$ | $V_{off}$ | $V_{off}$ | $V_{on}$ | $V_{on}$ | $V_{off}$ | $V_{off}$ | $V_{on}$ |
| Through $3_3 \leftrightarrow 3_4$ | $V_{on}$ | $V_{off}$ | $V_{on}$ | $V_{off}$ | $V_{off}$ | $V_{on}$ | $V_{off}$ | $V_{on}$ |

For example, as soon as the calibration standard "short" is to be connected for the terminal port $3_1$, the first transistor $20_1$ connected to the terminal port $3_1$ is switched into the conducting state, and the second transistor $21_1$ is switched into the off-state. In order to increase the isolation, the other transistors $20_2$, $21_2$, $20_3$, $21_3$, $20_4$ and $21_4$ are switched into the conducting state. The same applies for the calibration standards "open" and "match", both for the terminal port $3_1$ and also for the terminal ports $3_2$, $3_3$ and $3_4$. As soon as the calibration standard "through" is connected, the two second transistors $21_1$, $21_2$, $21_3$ and $21_4$ required for this are switched into the conducting state, and the further two second transistors $21_1$, $21_2$, $21_3$ and $21_4$ are switched into the off-state. The first transistors $20_1$, $20_2$, $20_3$ and $20_4$ each provide the contrary switching state to the second transistors $21_1$, $21_2$, $21_3$ and $21_4$ within the transistor pairs $27_1$, $27_2$, $27_3$ and $27_4$.

It is also possible for the three calibration standards "open", "short" and "match" to be adjusted and measured in parallel for all of the several ports of the network analyzer. Accordingly, especially with a large number of ports to be calibrated, the duration of the calibration procedure can be significantly reduced as a result.

Figure 4:
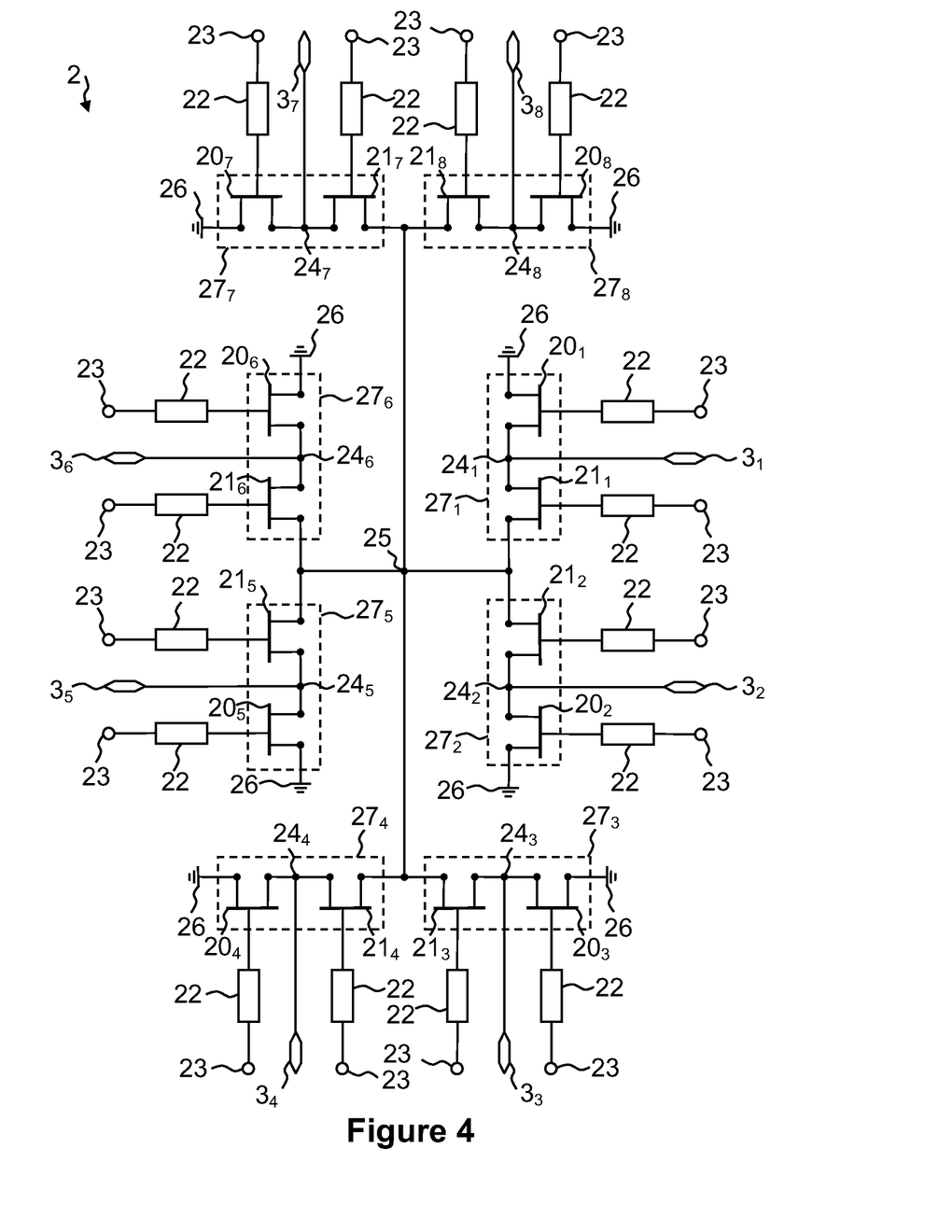
FIG. 4 shows a further block-circuit diagram of an exemplary embodiment of the calibration circuit according to the present disclosure for up to eight ports of the network analyzer to be calibrated.

FIG. 4 shows a further block-circuit diagram of an exemplary embodiment of the calibration circuit 2 according to the present disclosure for up to eight ports of the network analyzer to be calibrated. In each case, the illustration shows eight transistor pairs $27_1$, $27_2$, $27_3$, $27_4$, $27_5$, $27_6$, $27_7$ and $27_8$, which are connected to one another via the connecting line 25. As with the circuit arrangement from FIG. 2, it is also in FIG. 4, preferably the second terminals of the second transistors $21_1$, $21_2$, $21_3$, $21_4$, $21_5$, $21_6$, $21_7$ and $21_8$, which are connected to one another via the connecting line 25. The method of functioning of the individual transistor pairs $27_1$, $27_2$, $27_3$, $27_4$, $27_5$, $27_6$, $27_7$ and $27_8$ from FIG. 4 corresponds to the method of functioning of the transistor pairs $27_1$ and $27_2$ from FIG. 2, so that reference is made here to the corresponding part of the description for FIG. 2. In FIG. 4 also, those transistors $20_1$, $20_2$, $20_3$, $20_4$, $20_5$, $20_6$, $20_7$ and $20_8$ of which the first terminal is connected directly to the reference ground 26, can preferably be operated as the variable load. The gate voltage required for this must be adjusted very accurately, for example, with 100-μV accuracy.

A state table, which contains all of the required states of the transistors $20_1$ to $20_8$ and $21_1$ to $21_8$, is structured corresponding to tables (1) and (3). As a result of the fact that precisely one first transistor $20_1$ to $20_8$ and one second transistor $21_1$ to $21_8$ are present for every terminal port $3_1$, $3_2$, $3_3$, $3_4$, $3_5$, $3_6$, $3_7$ and $3_8$ of the calibration circuit 2 illustrated in FIG. 4, the calibration circuit 2 can be structured in a very compact manner, and the necessary connecting lines can be kept short, so that very high upper-threshold frequencies can be achieved.

It is also possible for the three calibration standards "open", "short" and "match" to be adjusted and measured for all of the several ports of the network analyzer. Accordingly, especially with a large number of ports to be calibrated, the duration of the calibration procedure can be significantly reduced.

Figure 5:
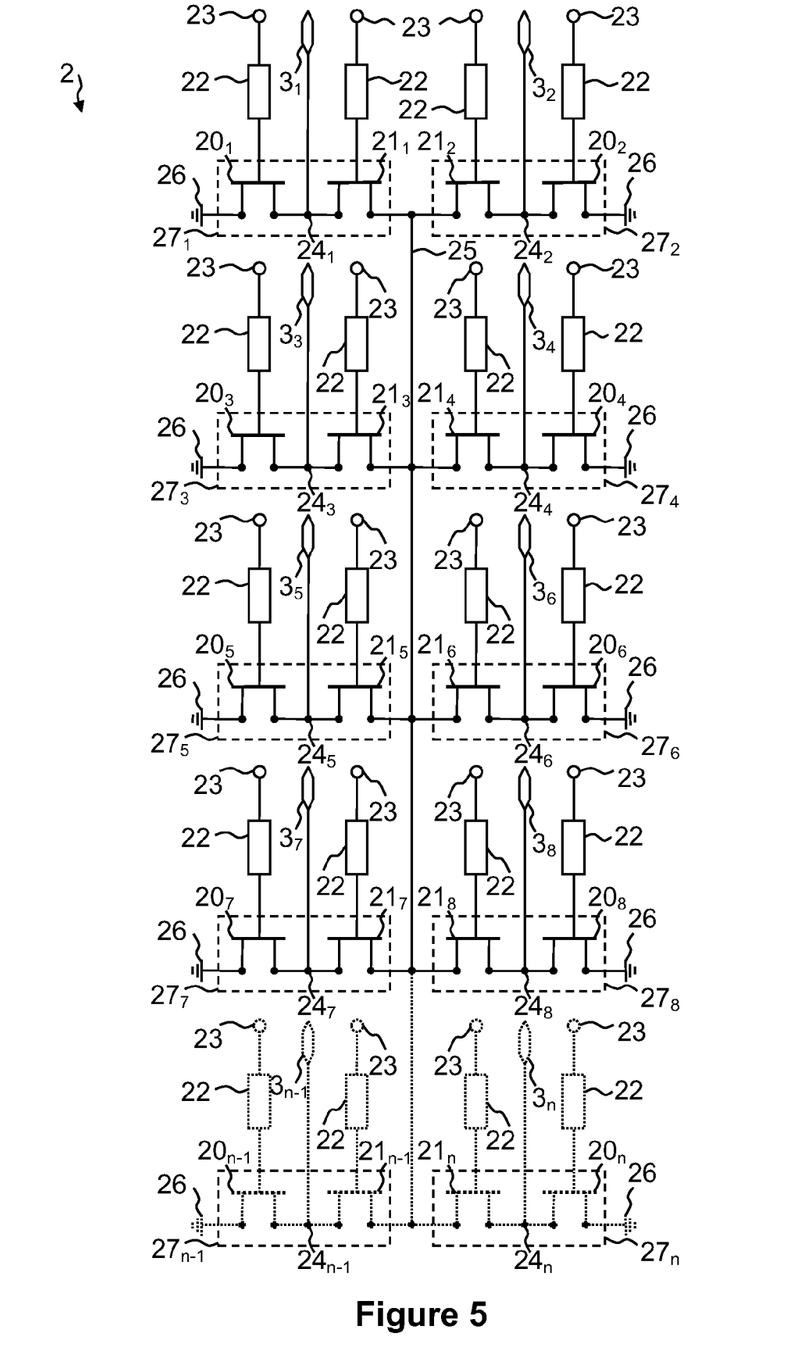
FIG. 5 shows a further block-circuit diagram of an exemplary embodiment of the calibration circuit according to the present disclosure for several ports of the network analyzer to be calibrated.

FIG. 5 shows a further block-circuit diagram of an exemplary embodiment of the calibration circuit 2 according to the present disclosure for several ports of the network analyzer to be calibrated. In each case, eight transistor pairs $27_1$, $27_2$, $27_3$, $27_4$, $27_5$, $27_6$, $27_7$ and $27_8$, which are connected to one another via the connecting line 25, are illustrated, as already shown in the circuit arrangement from FIG. 4. Furthermore, two further transistor pairs $27_{n-1}$ and $27_n$ are indicated by dotted lines. These dotted-line transistor pairs $27_{n-1}$ and $27_n$ are intended to show that the calibration circuit 2 can be extended for an arbitrary number of terminal ports $3_1$ to $3_{n-1}$, $3_n$, to wherein the following applies with regard to n: n∈N∩n>1.

As with the circuit arrangement from FIG. 2, it is also preferably the second terminals of the second transistors $21_1$ to $21_{n-1}$ and $21_n$ in FIG. 5, which are connected to one another via the connecting line 25. The method of functioning of the individual transistor pairs $27_1$ to $27_{n-1}$ and $27_n$ from FIG. 5 corresponds to the method of functioning of the transistor pairs $27_1$ and $27_2$ from FIG. 2, and reference is therefore made here to the corresponding part of the description for FIG. 2. In FIG. 5, those transistors $20_1$, $20_{n-1}$ and $20_n$, of which the first terminal is connected directly to the reference ground 26, can also preferably be operated as the variable load. The gate voltage required for this purpose must be capable of being adjusted very accurately, for example, with 100-μV accuracy.

A state table, which contains all of the required states of the transistors $20_1$, $20_{n-1}$ and $20_n$ and $21_1$ to $21_{n-1}$ and $21_n$, is structured corresponding to the tables (1) and (3). In view of the fact that precisely one first transistor $20_1$, $20_{n-1}$ and $20_n$ and one second transistor $21_1$ to $24_{n-1}$ and $21_n$ are present for each terminal port $3_1$ to $3_{n-1}$ and $3_n$ of the calibration circuit 2 illustrated in FIG. 5, the calibration circuit 2 can be structured in a very compact manner, and the necessary connecting lines can be kept short, so that very high upper-threshold frequencies can be achieved.

It is also possible for the three calibration standards "open", "short" and "match" to be adjustable and measurable for all of the several ports of the network analyzer. Accordingly, especially with a large number of ports to be calibrated, the duration of the calibration procedure can be significantly reduced.

Moreover, by preference, the first transistors $20_1$, $20_2$ to $20_n$, which are connected to the reference ground 26 by their first terminal, are embodied in such a manner that the gate width is significantly wider than the gate width of the second transistors $21_1$, $21_2$ to $21_n$. This guarantees that these create a very low-ohmic contact between the reference ground 26 and the common connection $27_1$, $27_2$ to $27_n$ to the terminal ports $3_1$, $3_2$ to $3_n$. A low-ohmic contact of this kind is important for the "short" measurement. If the first transistors $20_1$, $20_2$ to $20_n$ and the second transistors $21_1$, $21_2$ to $21_n$ are manufactured using a GaAs/InGaAs/AlGaAs-pHEMT semiconductor process, very good results are achieved for a gate length of 250 nm. To ensure that the first transistor $20_1$, $20_2$ to $20_n$ creates the lowest-ohmic contact possible, a gate width of, for example, 50 μm is advantageous. With an embodiment of this kind of the first transistors $20_1$, $20_2$ to $20_n$, a gate voltage of, for example, $V_{off}=-1.5$ V is sufficient for the first transistors to switch into an off-state. With a gate voltage of, for example, $V_{50}=-0.58$ V, the ohmic load, which is represented by the first transistors $20_1$, $20_2$ to $20_n$ provides a value of, for example, 50 ohms. By contrast, with a gate voltage of, for example, $V_{on}=0$ V, the first transistors $20_1$, $20_2$ to $20_n$ are in a conducting state.

The disadvantage with this large gate width is that the resulting gate area is included proportionally in the adjusted parasitic capacitances. Significant parasitic capacitances occur between the gate and drain and between the gate and source. At the same time, relatively large parasitic capacitances lead to a relatively lower upper-frequency threshold. For this reason, the second transistors $21_1$, $21_2$ to $21_n$ are preferably embodied with a relatively small gate width. In this context, the gate width of the second transistors $21_1$, $21_2$ to $21_n$ is preferably, for example, 25 μm. The resistive impedance is therefore in fact higher, but the useful frequency range of the calibration circuit 2 is considerably increased. Furthermore, a small gate width increases the stability of isolation of the second transistors $21_1$, $21_2$ to $21_n$. Accordingly, any parasitic paths occurring are more strongly attenuated.

Figure 6A:
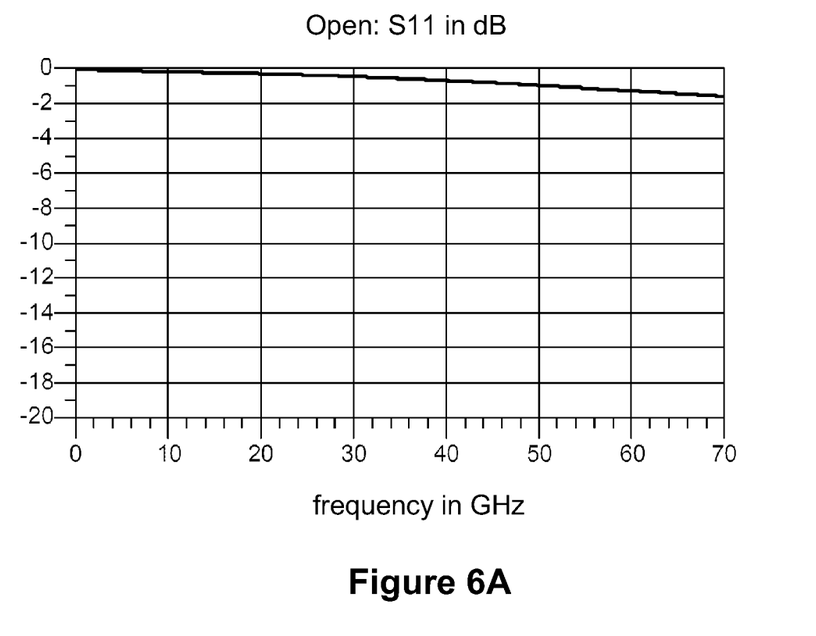
FIG. 6A shows an exemplary embodiment of an amplitude response of the calibration circuit according to the present disclosure plotted against the frequency for an "open" measurement.

FIG. 6A shows an exemplary embodiment of an amplitude response of the calibration circuit 2 according to the present disclosure plotted against the frequency for an "open" measurement. Within this measurement, the input-reflection factor $S_{11}$, for example, of the terminal port $3_1$ is displayed for an "open" measurement. The input-reflection factor $S_{11}$ is determined for a calibration circuit with four terminal ports $3_1$, $3_2$, $3_3$ to $3_4$, as illustrated in FIG. 3. Accordingly, the transistors $20_1$ and $21_1$ are disposed in the off-state, and the transistors $20_2$ to $20_4$ and $21_2$ to $21_4$ are disposed in the conducting state. It is evident that the returning wave itself is attenuated only marginally at a frequency of 70 GHz.

Figure 6B:
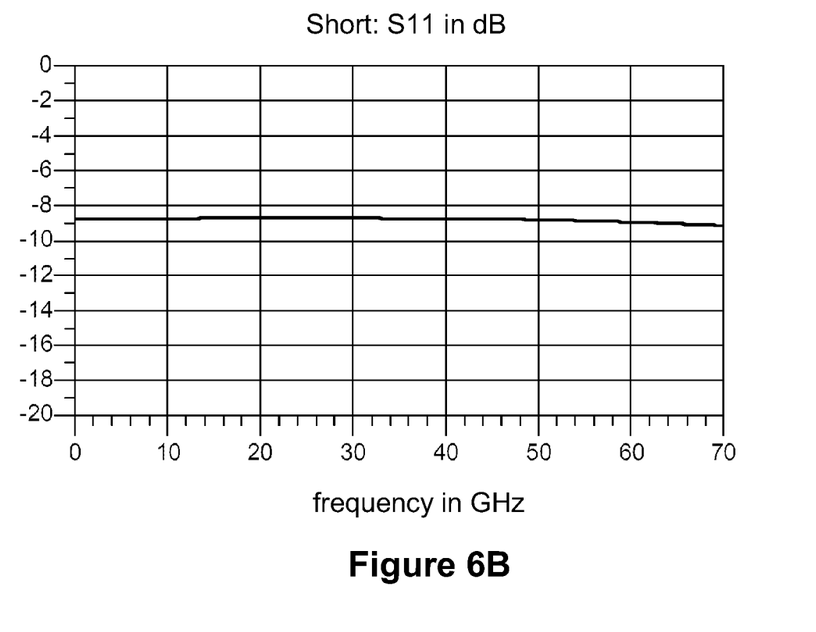
FIG. 6B shows an exemplary embodiment of an amplitude response of the calibration circuit according to the present disclosure plotted against the frequency for a "short" measurement.

FIG. 6B shows an exemplary embodiment of an amplitude response of the calibration circuit 2 according to the present disclosure plotted against the frequency for a "short" measurement. This measurement shows the S-parameter of the input reflection $S_{11}$, for example, of the terminal port $3_1$ for a "short" measurement. Accordingly, the transistor $20_1$ is in the conducting state, and the transistor $21_1$ is in the off-state. The further transistors $20_2$ to $20_4$ and $21_2$ to $21_4$ are all disposed in the conducting state. It is evident that the returning wave is more strongly attenuated than the returning wave in FIG. 6A. This is because the transistor $20_1$ represents a resistance even in the fully conducting state. Overall, however, the signal characteristic is very satisfactory.

Figure 6C:
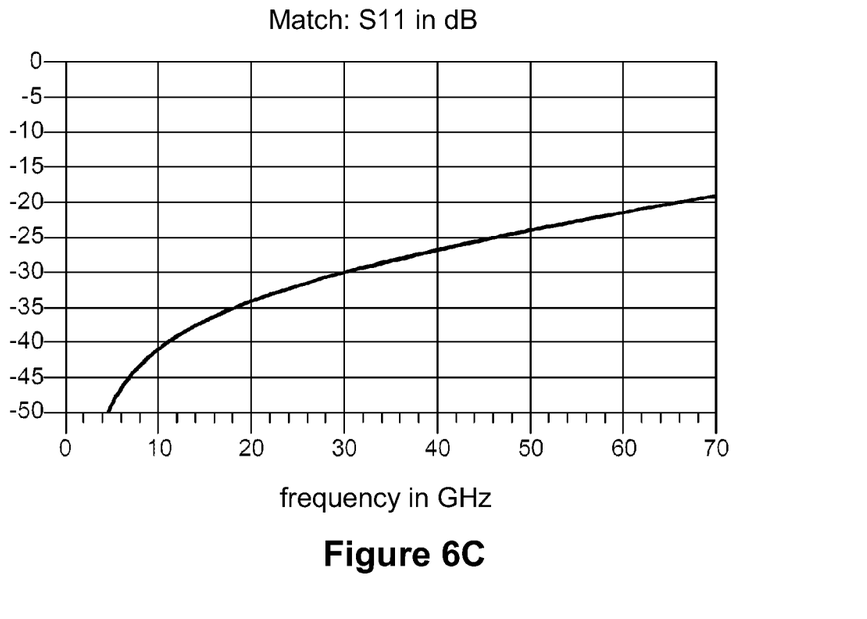
FIG. 6C shows an exemplary embodiment of an amplitude response of the calibration circuit according to the present disclosure plotted against the frequency for a "match" measurement.

FIG. 6C shows an exemplary embodiment of an amplitude response of the calibration circuit 2 according to the present disclosure plotted against the frequency for a "match" measurement. This measurement shows the S-parameter of the input reflection $S_{11}$, for example, of the terminal port $3_1$ for the "short" measurement. In this context, the transistor $20_1$ is operated as an adjustable load in such a manner that it preferably provides a resistance of 50 ohms for the frequency range to be used. For this purpose, as already explained, the control voltage or the gate voltage must be adjusted with a corresponding accuracy for the respective frequency. The transistor $21_1$ is in the off-state. The further transistors $20_2$ to $20_4$ and $21_2$ to $21_4$ are all disposed in the conducting state. It is evident that the returning wave for a low-frequency is very strongly attenuated in its amplitude, wherein the amplitude for the rising frequencies is less strongly attenuated. With a frequency of 70 GHz, the amplitude provides a value of approximately −19 dB.

However, even at 70 GHz, the attenuation is sufficient, because differentiation between the "match" measurement and the "open" measurement and the "short" measurement is guaranteed. The attenuation interval between the "match" measurement and the "short" measurement is still 10 dB, so that an adequate differentiation is still guaranteed between the individual signals even including the coaxial-coplanar microwave junction between the terminal ports $3_1$ to $3_4$ of the calibration circuit 2 and the external ports $4_1$ to $4_4$ of the calibration device 1 and the cable connection between the external ports $4_1$ to $4_4$ of the calibration device 1 and the network analyzer to be calibrated.

Figure 6D:
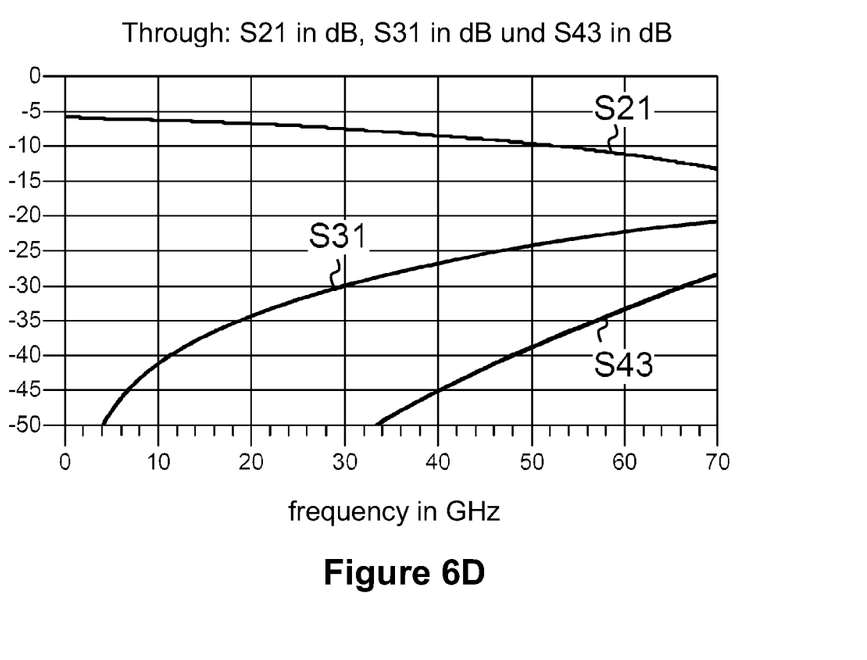
FIG. 6D shows an exemplary embodiment of an amplitude response of the calibration circuit according to the present disclosure plotted against the frequency for a "through" measurement.

FIG. 6D shows an exemplary embodiment of an amplitude response of the calibration circuit 2 according to the present disclosure plotted against the frequency for a "through" measurement. The terminal ports $3_1$ and $3_2$ in this context are connected via the transistors $21_1$ and $21_2$, which are both in a conductive state. The transistors $20_1$ and $20_2$ and the transistors $21_3$ and $21_4$ are in an off-state. In order to increase the isolation, the transistors $20_3$ and $20_4$ are, once again, in the conductive state.

A first signal characteristic S21 shows the forward transmission $S_{21}$ from the terminal port $3_1$ to the terminal port $3_2$. It is evident that the signal characteristic S21 is more strongly attenuated for high frequencies than for low frequencies, because, at high frequencies, the parasitic capacitances of the transistors $20_1$ to $20_4$ and $21_1$ to $21_4$ have a stronger effect, and because the transistors $21_1$ and $21_2$ retain a significant resistance value at relatively high frequencies even in the conducting state.

A second signal characteristic S31 shows the S-parameter of the forward transmission $S_{31}$ from the terminal port $3_1$ to the terminal port $3_3$. The terminal ports $3_1$ and $3_2$ are still connected to one another via the conducting transistors $21_1$ and $21_2$. The transistors $21_3$ and $21_4$ remain in the off-state. This signal characteristic S31 is very strongly attenuated for low frequencies, and even at frequencies of 70 GHz, it is still approximately 8 dB more strongly attenuated than the signal characteristic S21.

A third signal characteristic S43 shows the forward transmission S43 from the terminal port $3_3$ to the terminal port $3_4$. The terminal ports $3_1$ and $3_2$ are still connected to one another via the conducting transistors $21_1$ and $21_2$. The transistors $21_3$ and $21_4$ remain in the off-state. As might be expected, the signal characteristic S43 is more strongly attenuated than the signal characteristics S21 and S31.

The second signal characteristic 31 and the third signal characteristic 43 reflect the parasitic paths. If the second transistors $21_1$ to $21_n$ were to provide a wider gate width, the isolation capability would decline, and the signal characteristics 31 and 43 would be less strongly attenuated.

The aging of the calibration circuit 2, especially of the transistors $20_1$, $20_2$ to $20_n$ and $21_1$, $21_2$ to $21_n$ is reduced by applying only signals with low powers during the calibration procedure. A calibration interval of two years for the calibration device 1 itself is therefore sufficient.

Figure 7A:
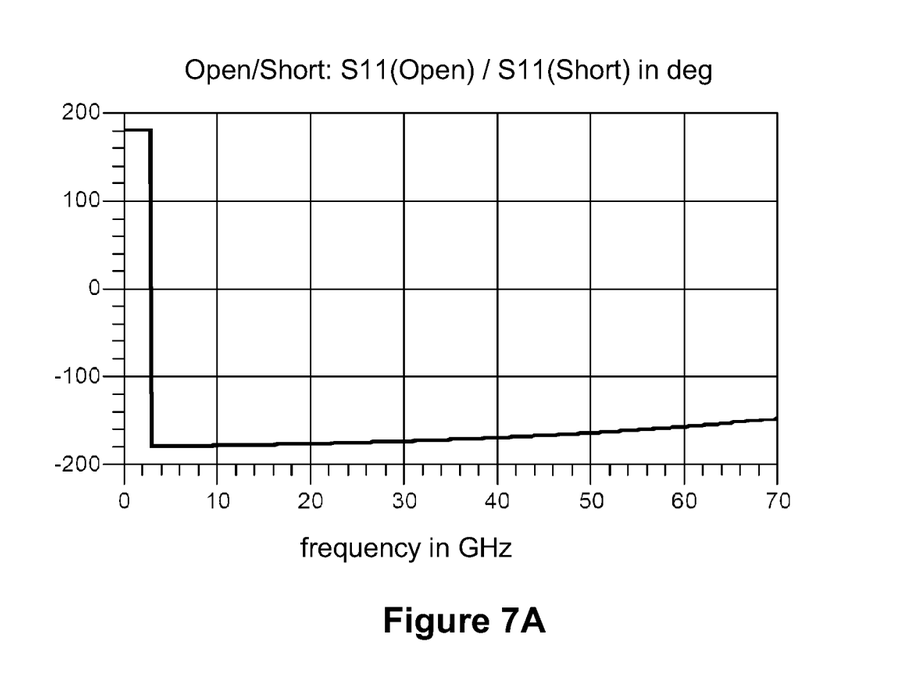
FIG. 7A shows an exemplary embodiment of a relationship between an "open" measurement and a "short" measurement of the calibration circuit according to the present disclosure plotted against the frequency.

FIG. 7A shows an exemplary embodiment of a relationship between an "open" measurement and a "short" measurement of the calibration circuits 2 according to the present disclosure plotted against the frequency. As already described, the differentiation between the "open" measurement and the "short" measurement is of essential importance, so that it is less relevant how frequency-independent the signal characteristic for an "open" measurement (FIG. 6A) or "short" measurement (FIG. 6B) is. In this context, the phase serves as a criterion for differentiation between the reflection standards "open" and "short". It is evident that, for low frequencies, a phase offset of 180° occurs between the "open" measurement and the "short" measurement. Even for relatively high frequencies, the phase offset is significantly closer to 180° than to 0°, so that the calibration circuits 2 according to the present disclosure allows a secure differentiation between the two reflection standards "open" and "short".

Figure 7B:
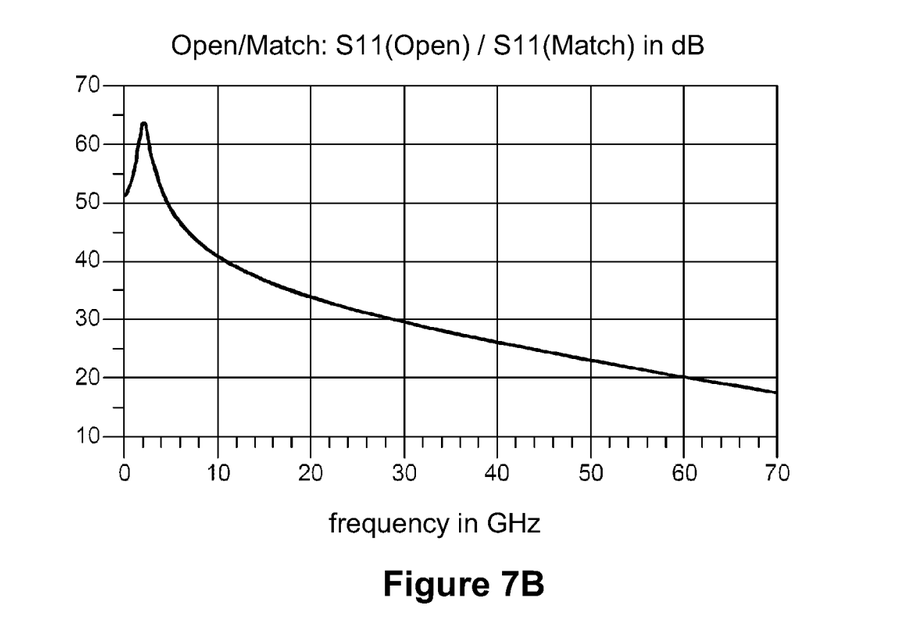
FIG. 7B shows an exemplary embodiment of a relationship between an "open" measurement and a "match" measurement of the calibration circuit according to the present disclosure plotted against the frequency.

FIG. 7B shows an exemplary embodiment of a relationship between an "open" measurement and a "match" measurement of the calibration circuit 2 according to the present disclosure plotted against the frequency. As already described, the differentiation between the "open" measurement and the "match" measurement is of great importance, so that, here also, it is less important how frequency-independent the signal characteristic for an "open" measurement (FIG. 6A) or "match" measurement (FIG. 6C) is. In this context, the amplitude serves as the criterion for differentiation between the reflection standard "open" and "match". It is evident that, for low frequencies, the relationship between the reflection standards "open" and "match" provides a high amplitude, which indicates good differentiation between the two reflection standards. Even for relatively high frequencies, the amplitude of the relationship between the reflection standards "open" and "match" is greater, at 18 dB, than 0 dB, so that it is possible to differentiate safely between the reflection standards "open" and "match".

Figure 7C:
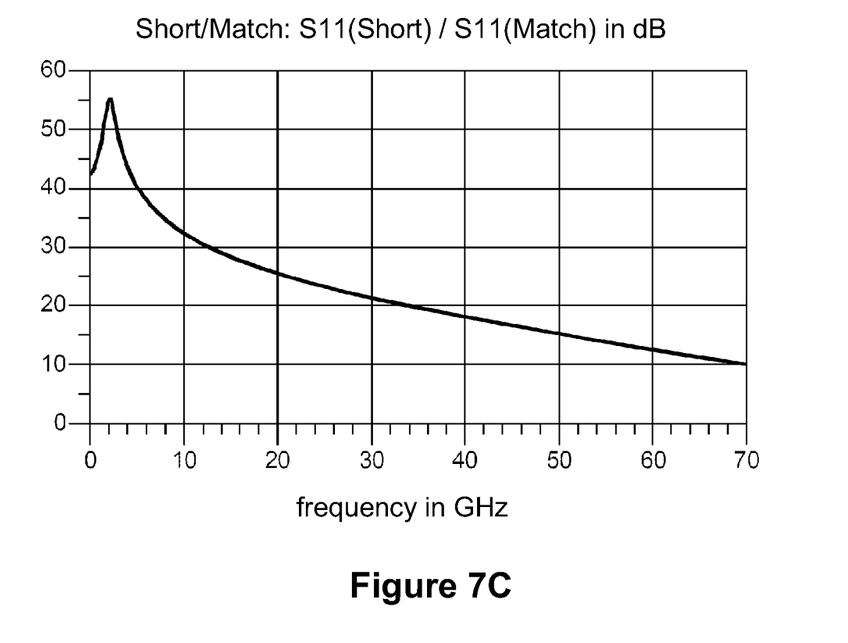
FIG. 7C shows an exemplary embodiment of a relationship between a "short" measurement and an "open" measurement of the calibration circuit according to the present disclosure plotted against the frequency.

FIG. 7C shows an exemplary embodiment of a relationship between a "short" measurement and an "open" measurement of the calibration circuit 2 according to the present disclosure plotted against the frequency. As already explained, the differentiation between the "short" measurement and the "match" measurement is also of great importance, so that it is therefore less relevant how frequency-independent the signal characteristic for a "short" measurement (FIG. 6B) or for a "match" measurement (FIG. 6C) ultimately is. In this context, the amplitude serves as the criterion for the differentiation between the reflection standards "short" and "match". It is evident that, for low frequencies, for the relationship between the reflection standards "short" and "match", a high amplitude is obtained, which indicates a good differentiation between the two reflection standards. However, even for relatively high frequencies, the amplitude of the relationship between the reflection standards "short" and "match" is significantly greater, at approximately 10 dB, than 0 dB, so that it is possible to differentiate safely between the reflection standards "open" and "match".

If the gate width of the second transistors $21_1$, $21_2$ to $21_n$ were to be enlarged to the gate width of the first transistors $20_1$, $20_2$ to $20_n$, the parasitic capacitances would rise in such a manner that a safe differentiation between the reflection standards "short" and "match" would no longer be safely possible.

Moreover, it is possible for an arbitrary value, such as 100 ohms or 200 ohms, to be adjusted for the first transistors $20_1$ to $20_n$ of the calibration device 1 operated as the adjustable load in order to increase the accuracy of the calibration and/or to establish the quality of the calibration. Similarly, the adjustment of arbitrary intermediate resistive states in the first transistors $20_1$ to $20_n$ allows devices under test, which provide a surge impedance different from 50 ohms, to be measured more accurately.

Within the framework of the present disclosure, all of the features described and/or illustrated can be combined with one another as required. The calibration device 1 can also be used for calibrating any other required measuring devices apart from a network analyzer, provided these require the connection of precisely known loads to their terminal ports.

The invention claimed is:

1. A calibration device for a network analyzer with several ports, comprising:
   one or more sources of gate voltage or base current;
   a calibration circuit that includes a plurality of terminal ports and a transistor pair for each terminal port of the plurality of terminal ports, each terminal port being configured to be connected to a corresponding one of several ports of the network analyzer, wherein the transistor pairs are connected to one another via a connecting line and each transistor pair comprising a first transistor and a second transistor connected in series via a common connection that is connected to the respective terminal port, wherein the first transistors are configured to be operated as an adjustable load that is adjustable by applying a gate voltage or a base current thereto from the one or more sources of gate voltage or base current, wherein the adjustable load refers to intermediate resistive states of the first transistors, and wherein when at least one port of the several ports of the network analyzer is under test, (1) at least one first transistor of the first transistors is operated as an adjustable load by applying an adjustable gate voltage or a base current thereto from the one or more sources of gate voltage or base current, and (2) the first transistor and the second transistor of each transistor pair that is connected to the respective terminal port corresponding to the ports of the several ports of the network analyzer that are not under test are switched into a conductive state.

2. The calibration device according to claim 1,
wherein when adjusting the gate voltage or the base current, temperature-dependent properties of the first transistors are compensated.

3. The calibration device according to claim 2,
wherein the calibration device provides a storage unit and the storage unit includes correction data, which take into consideration the temperature-dependent behavior of at least one of the transistors.

4. The calibration device according to claim 1,
wherein the calibration device contains a thermostatic control, so that the calibration circuit is heated to a constant temperature.

5. The calibration device according to claim 1,
wherein a first terminal of each first transistor is connected to a reference ground.

6. The calibration device according to claim 1,
wherein each first transistor and each second transistor forms a transistor pair and several such transistor pairs are connected to one another via a terminal of the respective second transistor not connected to the common connection.

7. The calibration device according to claim 1,
wherein the calibration circuit is disposed in an integrated circuit manufactured by an Monolithic Microwave Integrated Circuit (MMIC) process.

8. The calibration circuit according to claim 1,
wherein the terminal ports of the calibration circuit are connected to several external ports of the calibration device via a coaxial-coplanar microwave junction.

9. The calibration device according to claim 1,
wherein for each port of the network analyzer, the loading states are adjusted respectively by the first transistor and/or respectively the second transistor.

10. The calibration device according to claim 9,
wherein the adjustable load of the first transistor and/or the second transistor corresponds at least approximately to a system impedance of the network analyzer to be tested.

11. The calibration device according to claim 9,
wherein the loading states include open, short, and match, and wherein the loading states are adjusted and/or measured in parallel for all of the several ports of the network analyzer.

12. The calibration device according to claim 1,
wherein the transistors are field-effect transistors and a gate width of each first transistor is larger than a gate width of each second transistor.

13. The calibration device according to claim 1,
wherein the intermediate resistive states are disposed between a low-ohmic conducting state and a high-ohmic off-state.

14. A method for calibrating a network analyzer having several ports with a calibration device, the calibration device comprising one or more sources of gate voltage or base current and a calibration circuit that includes a plurality of terminal ports and a transistor pair for each terminal port of the plurality of terminal ports, each terminal port being configured to be coupled to a corresponding one of several ports of the network analyzer, wherein the transistor pairs are connected to one another via a connecting line and each transistor pair comprises a first transistor and a second transistor connected in series via a common connection that is connected to the respective terminal port, the method comprising:

coupling each terminal port of the plurality of terminal ports to a corresponding port of the several ports of the network analyzer;

operating at least one first transistor of a transistor pair of the transistor pairs as an adjustable load, wherein the at least one first transistor is associated with the transistor pair coupled to one port to be tested of the several ports of the network analyzer via a respective terminal port; and switching into a conductive state the first transistor and the second transistor of each transistor pair that is connected to the respective terminal port corresponding to the ports of the several ports of the network analyzer that are not being tested, wherein the at least one first transistor of a transistor pair of the transistor pairs is operated as an adjustable load by supplying a suitable gate voltage or a base current thereto via one of the sources of gate voltage or base current.

15. The method of claim 14, wherein the adjustable load being one of several intermediate resistive states.

16. The method of claim 15, wherein said switching into a conductive state includes supplying a suitable value of a gate voltage or base current to the respective first transistors and second transistors of the transistor pairs that are connected to the respective terminal port corresponding to the ports of the several ports of the network analyzer that are not being tested.

17. The method of claim 16, wherein the suitable value includes 0 volts or 0 amperes.

* * * * *

UNITED STATES PATENT AND TRADEMARK OFFICE
CERTIFICATE OF CORRECTION

PATENT NO. : 9,766,102 B2
APPLICATION NO. : 13/818452
DATED : September 19, 2017
INVENTOR(S) : M. Hassler et al.

It is certified that error appears in the above-identified patent and that said Letters Patent is hereby corrected as shown below:

On the Title Page

| Column | Line | Error |
|---|---|---|
| (74) Column 2 | Attorney, Agent, or Firm | "Chirstensen O'Connor Johnson Kindness PLLC" should read --Christensen O'Connor Johnson Kindness PLLC-- |

In the Claims

| Column | Line | Error |
|---|---|---|
| 13 (Claim 7, Line 3) | 46 | "an Monolithic" should read --a Monolithic-- |

Signed and Sealed this
Twenty-seventh Day of February, 2018

Andrei Iancu
*Director of the United States Patent and Trademark Office*